United States Patent
Berkhout

(10) Patent No.: US 7,271,655 B2
(45) Date of Patent: Sep. 18, 2007

(54) POWER AMPLIFIER END STAGE

(75) Inventor: Marco Berkhout, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/514,284

(22) PCT Filed: Apr. 23, 2003

(86) PCT No.: PCT/IB03/01706

§ 371 (c)(1),
(2), (4) Date: Nov. 12, 2004

(87) PCT Pub. No.: WO03/098796

PCT Pub. Date: Nov. 27, 2003

(65) Prior Publication Data

US 2005/0218988 A1    Oct. 6, 2005

(30) Foreign Application Priority Data

May 16, 2002   (EP) .................. 02076913

(51) Int. Cl.
H03F 3/26       (2006.01)

(52) U.S. Cl. ..................... 330/269; 330/274
(58) Field of Classification Search ............... 330/251, 330/269, 273, 274
See application file for complete search history.

(56) References Cited

U.S. PATENT DOCUMENTS 5,361,041 A * 11/1994 Lish .......................... 330/255

FOREIGN PATENT DOCUMENTS

WO    WO 01/91286 A1    11/2001

* cited by examiner

Primary Examiner—Steven J. Mottola

(57) ABSTRACT

In a push-pull power amplifier having an end stage (10) in which two power transistors (ML, MH) are connected in series, a dead time is normally used to ensure that the power transistors do not conduct simultaneously. The invention provides an end stage in which the dead time can be omitted. This is achieved by dimensioning the driver circuits (11, 12) in such a way that during switching the control voltages (Vgh, Vgl) of the power transistors cross their threshold level (VT) substantially simultaneously.

7 Claims, 2 Drawing Sheets

POWER AMPLIFIER END STAGE

Figure 1:
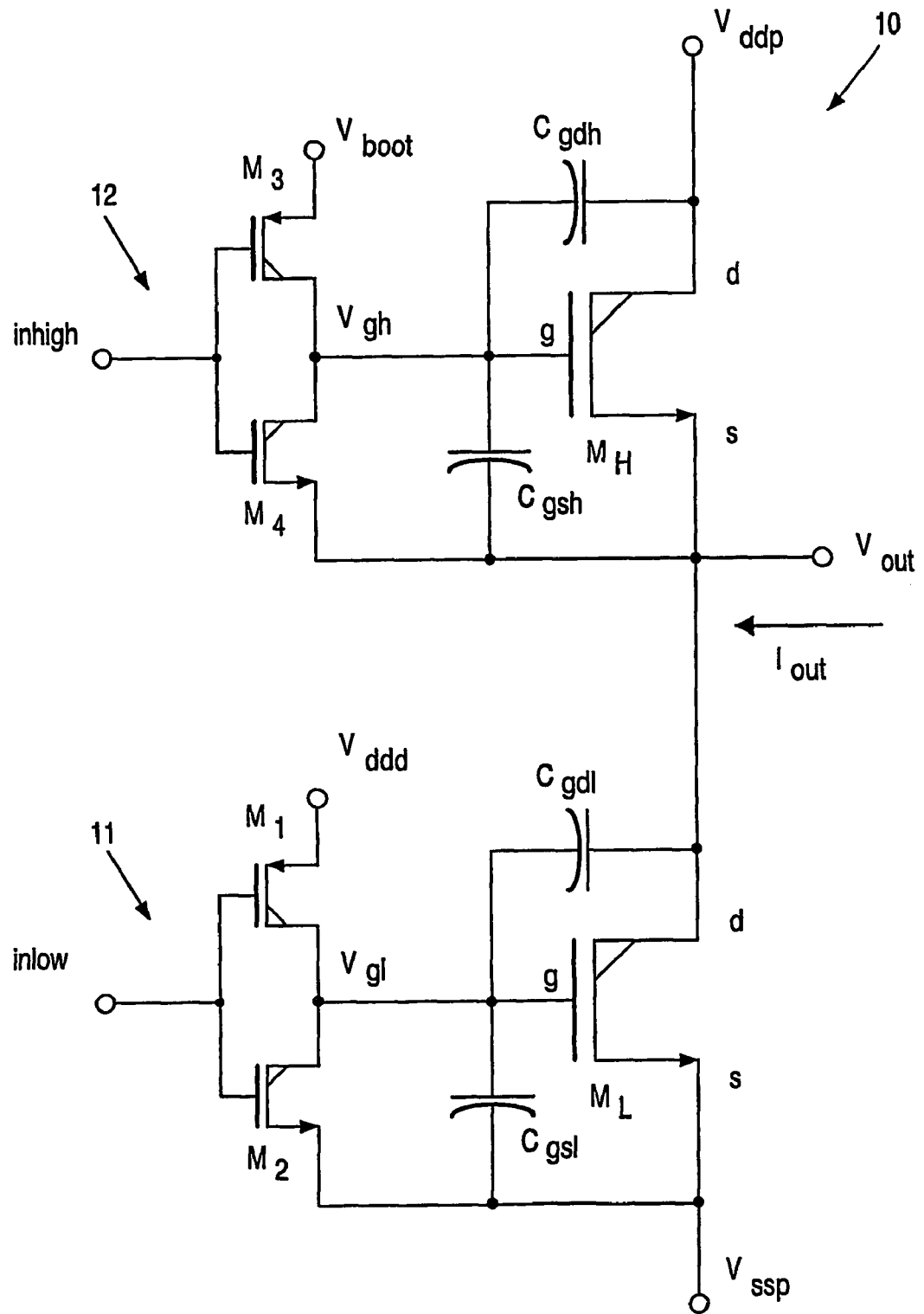

The present invention relates to a power amplifier end stage. More in particular, the present invention relates to an end stage circuit for a push-pull type amplifier, the end stage circuit comprising two power transistors connected in series and a driver circuit coupled to respective control terminals of the transistors.

In power amplifiers it is customary to connect two power transistors in series to form an end stage, one terminal of each transistor being coupled to the output terminal of the amplifier. A driver circuit provides suitable driver signals to the control terminals of the power transistors. In class D amplifiers, in which the power transistors essentially operate as switches, FET (Field Effect Transistor) type transistors are normally used. As the power transistors are connected in series, it should be avoided that they are both conducting at the same time, as this would cause an overcurrent in the end stage which might destroy the transistors. For this reason, the driver circuits are designed to introduce a so-called dead time during which neither transistor is conducting. It has been found, however, that this dead time causes distortion of the output signal.

A class D amplifier comprising two MOSFETs in a half bridge is disclosed in European Patent Application EP 1 003 279. The amplifier shown in FIG. 1A of said document further comprises an integrator, a pulse width modulator, a gate driver, a level shifter and a low pass output filter. Details of the level shifter and gate driver are not disclosed. Said document acknowledges the need for a dead time and proposes to provide symmetrical delays for the two power transistors so as to minimize the distortion caused by the dead time. Still, some distortion caused by the dead time remains.

It is an object of the present invention to solve this problem and other problems associated with the Prior Art and to provide an end stage for a power amplifier in which substantially no dead time distortion occurs.

Accordingly, the present invention provides an end stage circuit for a push-pull power amplifier, the end stage circuit comprising:

a first and a second power transistor connected in series, and a first and a second driver circuit coupled to respective control terminals of the power transistors, wherein the power transistors have a threshold voltage above which they are conductive and below which they are substantially non-conductive, wherein each driver circuit is arranged for receiving an input signal and for controlling the respective power transistor in response to said input signal, and wherein the driver circuits are arranged for causing the power transistors to cross their threshold voltage substantially simultaneously in respective opposite directions upon receipt of suitable input signals.

By causing the power transistors to cross their threshold voltage substantially simultaneously, one transistor is being switched on while the other transistor is being switched off. In this way, both an overlap of the conductive periods of the power transistors and a dead time are avoided. The invention is based on the insight that when the control voltage (gate voltage) crosses the threshold voltage of a FET-type transistor, the switching on or switching off of the transistor is not instantaneous but involves a (short) transition period. While it should be avoided that both transistors conduct at the same time, it is permissible for both transistors to be in this transition. This is particularly true when both control (that is, gate) voltages have sufficiently large but opposite gradients.

It is preferred that both driver circuits receive opposite input signals substantially simultaneously, that is, within a time interval of a few nanoseconds. This simplifies the design of the driver circuits. It is, however, possible to build in suitable delays for input signals not arriving substantially simultaneously at the input terminals of the driver circuits. In this context, opposite input signals are understood to be input signals having a step or a gradient in opposite directions, preferably one signal switching from "high" to "low" and the other signal switching from "low" to "high".

It is noted that the present invention overcomes the prejudice that a dead time is essential for a proper operation of a push-pull amplifier. As evidenced by the European Patent Application mentioned above, the necessity of a dead time is generally accepted, even though it is known to have disadvantages, such as the introduction of signal distortion.

In a preferred embodiment, the first driver circuit comprises a first driver transistor connected between a first auxiliary supply voltage and the control terminal of the first power transistor, and a second driver transistor connected between said control terminal and a main terminal of the first power transistor, while the second driver circuit comprises a third driver transistor connected between a second auxiliary supply voltage and the control terminal of the second power transistor, and a fourth driver transistor connected between said control terminal and a main terminal of the second power transistor.

Said main terminal is preferably the source of the power transistor, the control terminal being the gate. In this instant, the supply voltages are positive relative to the sources of the power transistors. Advantageously, in each driver circuit the drains of the first and second driver transistor are connected, the gates receiving the said input signal.

According to an important aspect of the present invention, the ratio of the resistance of the second driver transistor and the sum of the resistance of the second driver transistor and the third driver transistor substantially equals the ratio of the threshold voltage and the second auxiliary supply voltage. The term "resistance" in this respect is the drain-source resistance of the transistor when it is conducting, while the term "second auxiliary supply voltage" refers to the auxiliary supply voltage of the second driver circuit. Both the first and the second auxiliary supply voltage may, but do not need to be equal to the supply voltage of one of the power transistors.

Similarly, the ratio of the resistance of the first driver transistor and the sum of the resistance of the first driver transistor and the fourth driver transistor preferably substantially equals the ratio of the threshold voltage and the first auxiliary supply voltage. These ratios, which will later be explained in more detail, provide a proper timing of the control voltages supplied to the power transistors by the driver circuits.

Advantageously, the end stage circuit according to the invention further comprises a level shifter coupled to the driver circuits and providing switching signals at the input terminals substantially simultaneously. A level shifter particularly suitable for use in the present invention is disclosed in International Patent Application WO 01/91281 (Philips), the entire contents of which are incorporated herein by reference. Said level shifter is fast so as to provide suitable input signals to the driver circuits.

The present invention also provides a class D amplifier comprising an end stage circuit as defined above.

The present invention further provides a method of controlling the end stage of a push-pull amplifier comprising two power transistors connected in series, the power transistors having a threshold voltage above which they are conductive and below which they are substantially non-conductive, the method comprising the step of causing the power transistors to cross their threshold voltage substantially simultaneously in respective opposite directions when receiving opposite input signals substantially simultaneously.

Figure 2:
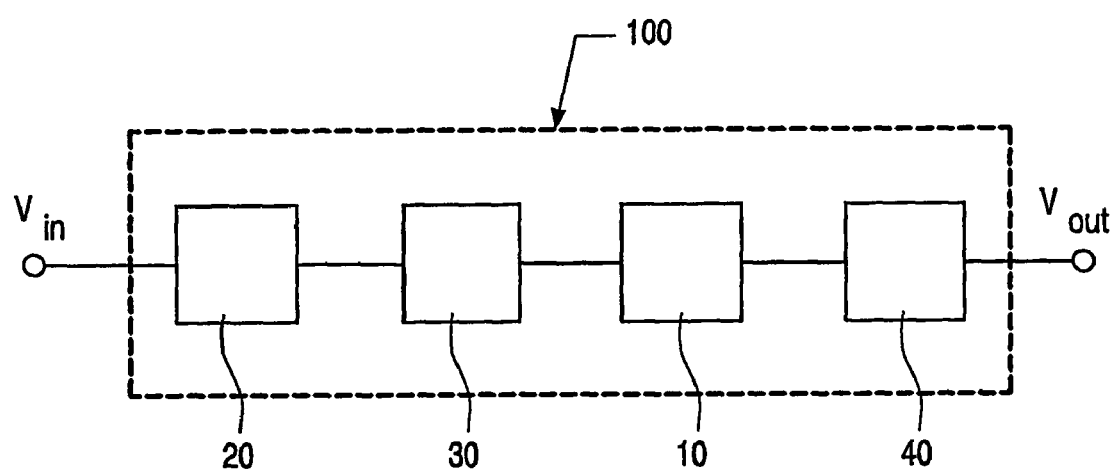

The present invention will further be explained below with reference to exemplary embodiments illustrated in the accompanying drawings, in which:

FIG. 1 schematically shows an end stage circuit according to the present invention;

FIG. 2 schematically shows a class D amplifier according to the present invention.

The power amplifier end stage circuit 10 shown merely by way of non-limiting example in FIG. 1 comprises a first power transistor $M_L$, a second power transistor $M_H$, a first driver circuit 11 and a second driver circuit 12. The power transistors are connected in series, the drain (d) of the first ("low side") power transistor $M_L$ being connected to the source (s) of the second ("high side") power transistor $M_H$. The connection of the two power transistors constitutes the output terminal of the end stage at which the output voltage $V_{out}$ is provided. An output current $I_{out}$ is shown to flow into the end stage. The source of the first power transistor $M_L$ is connected to a first (negative) supply voltage $V_{ssp}$, while the drain of the second power transistor $M_H$ is connected to a second (positive) supply voltage $V_{ddp}$.

Each driver circuit 11, 12 comprises a pair of transistors $M_1$, $M_2$ and $M_3$, $M_4$ respectively. The gates of each pair are connected to an input terminal so as to receive an input signal inlow, inhigh respectively, while the drains of each pair are connected to the gate (g) of the respective power transistor. The source of the first driver transistor $M_1$, $M_3$ of each driver circuit is connected to an auxiliary supply voltage $V_{ddd}$, $V_{boot}$ respectively. The source of the second driver transistor $M_2$, $M_4$ of each driver circuit is connected to the source of the corresponding power transistor $M_L$, $M_H$.

Capacitances $C_{gdl}$ and $C_{gdh}$ are present between the gate and the drain of the first and second power transistor respectively. Similarly, capacitances $C_{gsl}$ and $C_{gsh}$ are present between the gate and the source of the first and second power transistor respectively. These capacitances are "parasitic" in that they are not present by design but due to the physical properties of the transistors.

The end stage circuit 10 operates as follows. Assume that the first power transistor $M_L$ is conducting. This causes the output voltage $V_{out}$ to be low. It is further assumed that the output current $I_{out}$ is zero, and that the input signals change simultaneously, the first input signal Inlow from "low" to "high" and the second input signal Inhigh from "high" to "low". Consequently, the gate of the first power transistor $M_L$ is discharged through the second driver transistor $M_2$ while the gate of the second power transistor $M_H$ is charged through the third driver transistor $M_3$. It is noted that the gate voltage $V_{g1}$ of the first power transistor $M_L$ originally was approximately equal to $V_{ddd}$, while the gate voltage $V_{gh}$ of the second power transistor $M_H$ originally was approximately equal to $V_{out}$, which in turn was approximately equal to $V_{ssp}$.

According to an important aspect of the present invention, the ratio of the resistance $R_{on2}$ of the second driver transistor $M_2$ and the sum of the resistance $R_{on}$ of the second driver transistor $M_2$ and the resistance $R_{on3}$ of the third driver transistor $M_3$ substantially equals the ratio of the threshold voltage $V_T$ and the second auxiliary supply voltage $V_{boot}$:

$$R_{on2}/(R_{on2}+R_{on3}) \approx V_T/V_{boot}.$$

The term "resistance" in this respect is the drain-source resistance of the transistor when it is conducting or "on", hence Ron.

Similarly, the ratio of the resistance $R_{on1}$ of the first driver transistor $M_1$ and the sum of the resistance $R_{on1}$ of the first driver transistor $M_1$ and the resistance $R_{on4}$ of the fourth driver transistor $M_4$ preferably substantially equals the ratio of the threshold voltage $V_T$ and the first auxiliary supply voltage $V_{ddd}$:

$$R_{on1}/(R_{on1}+R_{on4}) \approx V_T/V_{ddd}.$$

Due to these ratios the discharging of the gate of $M_L$ proceeds faster than the charging of the gate of $M_H$. As a result, the gate-source voltages of the power transistors $M_L$ and $M_H$ cross their threshold voltage $V_T$ (approximately 2.5 V) at substantially the same instant.

This will cause the first power transistor $M_L$ to start conducting and the second power transistor $M_H$ to stop conducting. Even though this transition lasts only a few nanoseconds (ns), it is not instantaneous and during a brief time period $M_L$ will become more conductive while $M_H$ becomes less conductive. However, neither transistor will be fully conductive during this transition period, thus avoiding any substantial cross-currents through both power transistors. As both power transistors switch at virtually the same instant, the dead time is eliminated, thus avoiding any distortion caused by such a dead time.

An amplifier 100 comprising an end stage 10 of the present invention may further comprise a pulse width modulator 20, a level shifter 30, and a low-pass output filter 40. Such an amplifier is schematically shown in FIG. 2.

Advantageously, the circuit of the present invention is incorporated in an integrated circuit (IC). This will cause all components to have similar physical characteristics and to have substantially the same temperature, thus making the design simpler. In particular, this will provide the possibility for the first and the second power transistor to be virtually identical.

As illustrated above, the present invention eliminates the distortion caused by dead time in power end stages by providing an end stage in which no dead time is required. The driver circuits are configured so as to carefully time the conducting periods of the power transistors, avoiding overlap of these periods while substantially eliminating the dead time. The design of the driver circuits is based on the insight that the threshold voltage of FET type transistors defines a switch-on and switch-off region rather than a sharp switch-on or switch-off point. Provided the gate signals have a sufficient gradients of opposite signs, both gate signals can be at the threshold voltage at substantially the same time.

It is noted that any terms used in this documents should not be construed so as limit the scope of the present invention. In particular, the words "comprise(s)" and "comprising" are not meant to exclude any elements not specifically stated. Single (circuit) elements may be substituted with multiple (circuit) elements or with their equivalents.

Accordingly, it will be understood by those skilled in the art that the present invention is not limited to the embodiments illustrated above and that many modifications and additions may be made without departing from the scope of the invention as defined in the appending claims.

The invention claimed is:

1. An end stage circuit for a push-pull power amplifier, the end stage circuit comprising:
   a first and a second power transistor connected in series, and
   a first and a second driver circuit coupled to respective control terminals of the power transistors,
   wherein the power transistors have a threshold voltage above which they are conductive and below which they are substantially non-conductive,
   wherein each driver circuit is arranged for receiving an input signal and for controlling the respective power transistor in response to said input signal, and
   wherein the driver circuits are arranged for causing the power transistors to cross their threshold voltage substantially simultaneously in respective opposite directions upon receipt of suitable input signals, and
   wherein the first driver circuit comprises a first driver transistor connected between a first auxiliary supply voltage and the control terminal of the first power transistor, and a second driver transistor connected between said control terminal and a main terminal of the first power transistor, and wherein the second driver circuit comprises a third driver transistor connected between a second auxiliary supply voltage and the control terminal of the second power transistor, and a fourth driver transistor connected between said control terminal and a main terminal of the second power transistor.

2. An end stage circuit according to claim 1, wherein the ratio of the resistance of the second driver transistor and the sum of the resistance of the second driver transistor and the third driver transistor substantially equals the ratio of the threshold voltage and the second auxiliary supply voltage.

3. An end stage circuit according to claim 1, wherein the ratio of the resistance of the first driver transistor and the sum of the resistance of the first driver transistor and the fourth driver transistor substantially equals the ratio of the threshold voltage and the first auxiliary supply voltage.

4. An end stage circuit according to claim 1, further comprising a level shifter coupled to the driver circuit and providing switching signals at the input terminals substantially simultaneously.

5. An end stage circuit according to claim 1, implemented in an integrated circuit.

6. A class D amplifier comprising an end stage circuit according to claim 1.

7. A method of controlling the end stage of a push-pull amplifier comprising two power transistors connected in series, the power transistors having a threshold voltage above which they are conductive and below which they are substantially non-conductive, the method comprising the step of:
   causing the power transistors to cross their threshold voltage substantially simultaneously in respective opposite directions when receiving opposite input signals substantially simultaneously, wherein causing includes (i) using a first driver circuit having a first driver transistor connected between a first auxiliary supply voltage and a control terminal of a first one of the two power transistors, and a second driver transistor connected between said control terminal and a main terminal of the first one of the two power transistors, and (ii) using a second driver circuit having a third driver transistor connected between a second auxiliary supply voltage and a control terminal of a second one of the two power transistors, and a fourth driver transistor connected between said control terminal and a main terminal of the second one of the two power transistors.

* * * * *